US010580480B2

(12) United States Patent
Lee et al.

(10) Patent No.: US 10,580,480 B2
(45) Date of Patent: Mar. 3, 2020

(54) SEMICONDUCTOR MEMORY APPARATUS

(71) Applicant: SK hynix Inc., Icheon-si, Gyeonggi-do (KR)

(72) Inventors: Jung Hwan Lee, Guri-si (KR); Dae Yong Shim, Seoul (KR); Kang Seol Lee, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/441,945

(22) Filed: Jun. 14, 2019

(65) Prior Publication Data

US 2019/0295625 A1    Sep. 26, 2019

Related U.S. Application Data

(63) Continuation of application No. 15/685,182, filed on Aug. 24, 2017, now Pat. No. 10,332,585.

(30) Foreign Application Priority Data

Dec. 26, 2016    (KR) .......... 10-2016-0179023

(51) Int. Cl.
| | |
|---|---|
| *G11C 11/408* | (2006.01) |
| *G11C 11/4094* | (2006.01) |
| *G11C 11/4091* | (2006.01) |
| *G11C 5/14* | (2006.01) |
| *G11C 7/08* | (2006.01) |
| *G11C 11/4074* | (2006.01) |

(52) U.S. Cl.
CPC .......... *G11C 11/4085* (2013.01); *G11C 5/147* (2013.01); *G11C 7/08* (2013.01); *G11C 11/4074* (2013.01); *G11C 11/4091* (2013.01); *G11C 11/4094* (2013.01)

(58) Field of Classification Search
CPC ... G11C 11/4085; G11C 7/08; G11C 11/4074; G11C 5/147; G11C 11/4091; G11C 11/4094
USPC .......................................................... 326/83
See application file for complete search history.

(56) References Cited

U.S. PATENT DOCUMENTS

| | | | |
|---|---|---|---|
| 2009/0161448 A1 | 6/2009 | Lee | |
| 2010/0109735 A1* | 5/2010 | Lee | ........................... G11C 7/08 327/288 |
| 2012/0275251 A1 | 11/2012 | Jin et al. | |
| 2012/0320687 A1* | 12/2012 | Kim | ........................ G11C 7/08 365/189.06 |
| 2013/0088912 A1* | 4/2013 | Son | .......................... G11C 7/08 365/149 |

(Continued)

FOREIGN PATENT DOCUMENTS

KR    1020150139287 A    12/2015

*Primary Examiner* — Don P Le
(74) *Attorney, Agent, or Firm* — William Park & Associates Ltd.

(57) ABSTRACT

A semiconductor memory apparatus includes a driving voltage providing circuit suitable for selectively providing a first driving voltage, a second driving voltage, a third driving voltage, a ground voltage, and a precharge voltage to a first driving line and a second driving line in response to an active signal, a cell characteristic information signal, and a precharge signal. The semiconductor memory apparatus also includes a sense amplifier suitable for operating by being applied with voltages provided from the first and second driving lines.

8 Claims, 4 Drawing Sheets

(56) References Cited

U.S. PATENT DOCUMENTS

| | | | |
|---|---|---|---|
| 2015/0049565 A1* | 2/2015 | Xia | G11C 7/065 |
| | | | 365/207 |
| 2017/0133084 A1* | 5/2017 | Hwang | G11C 11/4094 |
| 2017/0236573 A1 | 8/2017 | Kim | |

* cited by examiner

US 10,580,480 B2

SEMICONDUCTOR MEMORY APPARATUS

CROSS-REFERENCES TO RELATED APPLICATION

The present application is a continuation application for U.S. patent application Ser. No. 15/685,182, filed on Aug. 24, 2017, and claims priority under 35 U.S.C. § 119(a) to Korean application number 10-2016-0179023, filed on Dec. 26, 2016, in the Korean Intellectual Property Office, which is incorporated herein by reference in its entirety.

BACKGROUND

1. Technical Field

Various embodiments generally relate to a semiconductor integrated circuit, and, more particularly, to a semiconductor memory apparatus.

2. Related Art

Semiconductor memory apparatuses are configured to store data and output stored data.

Memory cells which store data in a semiconductor memory apparatus may have different times of retaining stored data, according to the characteristics thereof.

It is inefficient to sense and amplify the memory cells with different characteristics under the same condition.

SUMMARY

In an embodiment, a semiconductor memory apparatus may include: a driving voltage providing circuit suitable for selectively providing a first driving voltage, a second driving voltage, a third driving voltage, a ground voltage, and a precharge voltage to a first driving line and a second driving line in response to an active signal, a cell characteristic information signal, and a precharge signal; and a sense amplifier suitable for operating by being applied with voltages provided from the first and second driving lines.

In an embodiment, a semiconductor memory apparatus may include: a plurality of mats; a plurality of sense amplifiers electrically coupled with the plurality of mats, respectively; and a plurality of driving voltage providing circuits suitable for selectively providing driving voltages to the plurality of sense amplifiers, respectively, in response to a plurality of cell characteristic information signals.

DETAILED DESCRIPTION

Hereinafter, a semiconductor memory apparatus will be described below with reference to the accompanying drawings through various examples of embodiments.

Figure 1:
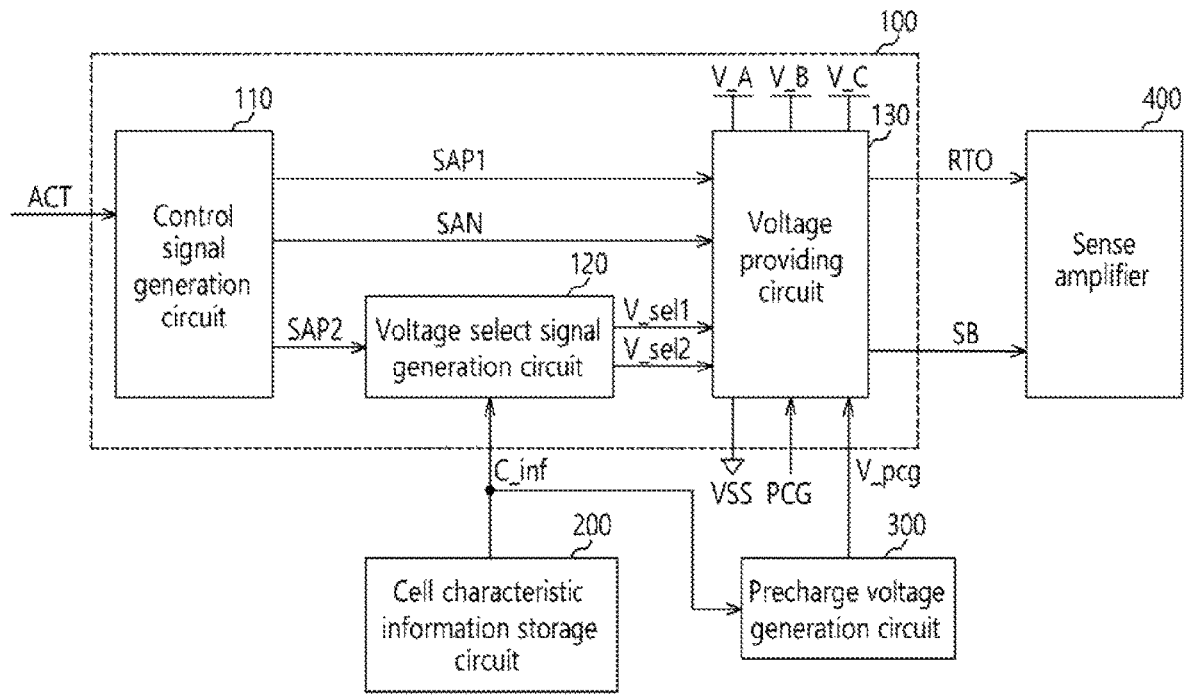
FIG. 1 is a configuration diagram illustrating a representation of an example of a semiconductor memory apparatus in accordance with an embodiment.

As shown in FIG. 1, a semiconductor memory apparatus in accordance with an embodiment may include a driving voltage providing circuit 100, a cell characteristic information storage circuit 200, a precharge voltage generation circuit 300, and a sense amplifier 400.

The driving voltage providing circuit 100 may selectively apply at least one of a first driving voltage V_A, a second driving voltage V_B, a third driving voltage V_C, a ground voltage VSS, and a precharge voltage V_pcg to at least one of a first driving line RTO and a second driving line SB in response to at least one of an active signal ACT, a cell characteristic information signal C_inf, and a precharge signal PCG. For example, the driving voltage providing circuit 100 may selectively provide two driving voltages among the first to third driving voltages V_A, V_B and V_C to the first driving line RTO and provide the ground voltage VSS to the second driving line SB, in response to the active signal ACT and the cell characteristic information signal C_inf. The driving voltage providing circuit 100 may provide the precharge voltage V_pcg to the first and second driving lines RTO and SB in response to the precharge signal PCG. The first driving voltage V_A may be a first external voltage (VDD), the second driving voltage V_B may be a core voltage (VCORE), and the third driving voltage V_C may be a second external voltage (VSOD). The first driving voltage V_A may be equal to or higher than the voltage level of the second driving voltage V_B. The third driving voltage V_C may be equal to or higher than the voltage level of the first driving voltage V_A. The third driving voltage V_C may be higher than the voltage level of the second driving voltage V_B.

The driving voltage providing circuit 100 may include a control signal generation circuit 110, a voltage select signal generation circuit 120, and a voltage providing circuit 130.

The control signal generation circuit 110 may generate a first sense amplifier driving control signal SAP1, a second sense amplifier driving control signal SAP2, and a third sense amplifier driving control signal SAN in response to the active signal ACT. For example, if the active signal ACT is enabled, the control signal generation circuit 110 enables the first sense amplifier driving control signal SAP1 for a first predetermined time, and enables the second sense amplifier driving control signal SAP2 for a second predetermined time when the first sense amplifier driving control signal SAP1 is disabled. The control signal generation circuit 110 enables the third sense amplifier driving control signal SAN for a period in which at least one of the first and second sense amplifier driving control signals SAP1 and SAP2 is enabled. That is to say, the control signal generation circuit 110 enables the third sense amplifier driving control signal SAN for a time that is obtained by summing the first predetermined time and the second predetermined time.

The voltage select signal generation circuit 120 may output the second sense amplifier driving control signal SAP2 as one of a first voltage select signal V_sel1 and a second voltage select signal V_sel2 in response to the cell characteristic information signal C_inf. For example, the voltage select signal generation circuit 120 may output the second sense amplifier driving control signal SAP2 as the first voltage select signal V_sel1 when the cell characteristic information signal C_inf is enabled, and output the second sense amplifier driving control signal SAP2 as the second voltage select signal V_sel2 when the cell characteristic information signal C_inf is disabled. The voltage select signal generation circuit 120 may include a multiplexer.

The voltage providing circuit 130 may selectively provide at least one of the first to third driving voltages V_A, V_B, and V_C, the ground voltage VSS, and the precharge voltage V_pcg to at least one of the first and second driving lines RTO and SB in response to at least one of the first and third sense amplifier driving control signals SAP1 and SAN, the first and second voltage select signals V_sel1, and V_sel2 and the precharge signal PCG. For example, the voltage providing circuit 130 may provide the first driving voltage V_A to the first driving line RTO for the enable period of the first sense amplifier driving control signal SAP1. The voltage providing circuit 130 may apply the ground voltage VSS and the precharge voltage V_pcg to the second driving line SB in response to the third sense amplifier driving control signal SAN and the precharge signal PCG. The voltage providing circuit 130 may provide the second driving voltage V_B to the first driving line RTO for the enable period of the first voltage select signal V_sel1. The voltage providing circuit 130 may provide the third driving voltage V_C to the first driving line RTO for the enable period of the second voltage select signal V_sel2. The voltage providing circuit 130 may provide the precharge voltage V_pcg to the first and second driving lines RTO and SB for the enable period of the precharge signal PCG.

The cell characteristic information storage circuit 200 may store and provide information according to characteristics of a memory cell, as the cell characteristic information signal C_inf. The cell characteristic information storage circuit 200 may include a fuse circuit which determines whether to cut a fuse depending on the characteristic of a memory cell and generates the cell characteristic information signal C_inf depending on whether the fuse is cut. The cell characteristic information storage circuit 200 may include a register circuit which stores information according to the characteristic of a memory cell, as the cell characteristic information signal C_inf. The characteristic of a memory cell may represent whether a time which the memory cell is able to retain data is longer or shorter than a reference time. For example, when the data retention time of a memory cell is longer than the reference time, the cell characteristic information storage circuit 200 is configured to enable the cell characteristic information signal C_inf. When the data retention time of a memory cell is shorter than the reference time, the cell characteristic information storage circuit 200 is configured to disable the cell characteristic information signal C_inf.

The precharge voltage generation circuit 300 may select the voltage level of the precharge voltage V_pcg in response to the cell characteristic information signal C_inf. For example, the precharge voltage generation circuit 300 may generate the precharge voltage V_pcg of a higher voltage level when the cell characteristic information signal C_inf is disabled than when the cell characteristic information signal C_inf is enabled. Accordingly, the precharge voltage generation circuit 300 may generate the precharge voltage V_pcg of a lower voltage level when the cell characteristic information signal C_inf is enabled than when the cell characteristic information signal C_inf is disabled.

The sense amplifier 400 may operate by being provided with the voltages transferred from the first and second driving lines RTO and SB.

Figure 2:
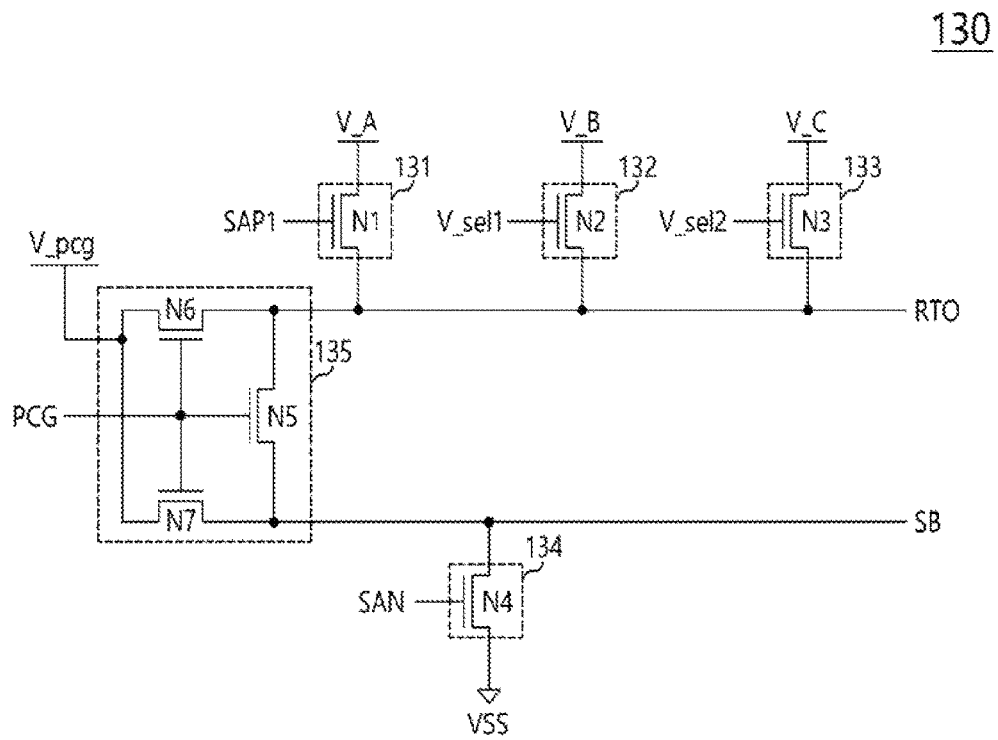
FIG. 2 is a configuration diagram illustrating a representation of an example of the voltage providing circuit shown in FIG. 1.

As shown in FIG. 2, the voltage providing circuit 130 may include a first voltage applying circuit 131, a second voltage applying circuit 132, a third voltage applying circuit 133, a fourth voltage applying circuit 134, and a precharge voltage applying circuit 135.

The first voltage applying circuit 131 may apply the first driving voltage V_A to the first driving line RTO when the first sense amplifier driving control signal SAP1 is enabled.

The first voltage applying circuit 131 may include a first transistor N1. The first transistor N1 has a gate which is inputted with the first sense amplifier driving control signal SAP1, a drain which is applied with the first driving voltage V_A, and a source to which the first driving line RTO is coupled.

The second voltage applying circuit 132 may apply the second driving voltage V_B to the first driving line RTO when the first voltage select signal V_sel1 is enabled.

The second voltage applying circuit 132 may include a second transistor N2. The second transistor N2 has a gate which is inputted with the first voltage select signal V_sel1, a drain which is applied with the second driving voltage V_B, and a source to which the first driving line RTO is coupled.

The third voltage applying circuit 133 may apply the third driving voltage V_C to the first driving line RTO when the second voltage select signal V_sel2 is enabled.

The third voltage applying circuit 133 may include a third transistor N3. The third transistor N3 has a gate which is inputted with the second voltage select signal V_sel2, a drain which is applied with the third driving voltage V_C, and a source to which the first driving line RTO is coupled.

The fourth voltage applying circuit 134 may apply the ground voltage VSS to the second driving line SB when the third sense amplifier driving control signal SAN is enabled.

The fourth voltage applying circuit 134 may include a fourth transistor N4. The fourth transistor N4 has a gate which is inputted with the third sense amplifier driving control signal SAN, a drain to which the second driving line SB is coupled, and a source which is applied with the ground voltage VSS.

The precharge voltage applying circuit 135 may couple the first and second driving lines RTO and SB and apply the precharge voltage V_pcg to the first and second driving lines RTO and SB, when the precharge signal PCG is enabled.

The precharge voltage applying circuit 135 may include fifth to seventh transistors N5, N6, and N7. The fifth transistor N5 has a gate which is inputted with the precharge signal PCG, a drain to which the first driving line RTO is coupled, and a source to which the second driving line SB is coupled. The sixth transistor N6 has a gate which is inputted with the precharge signal PCG, a drain which is applied with the precharge voltage V_pcg, and a source to which the first driving line RTO is coupled. The seventh transistor N7 has a gate which is inputted with the precharge signal PCG, a drain which is applied with the precharge voltage V_pcg, and a source to which the second driving line SB is coupled.

Figure 3:
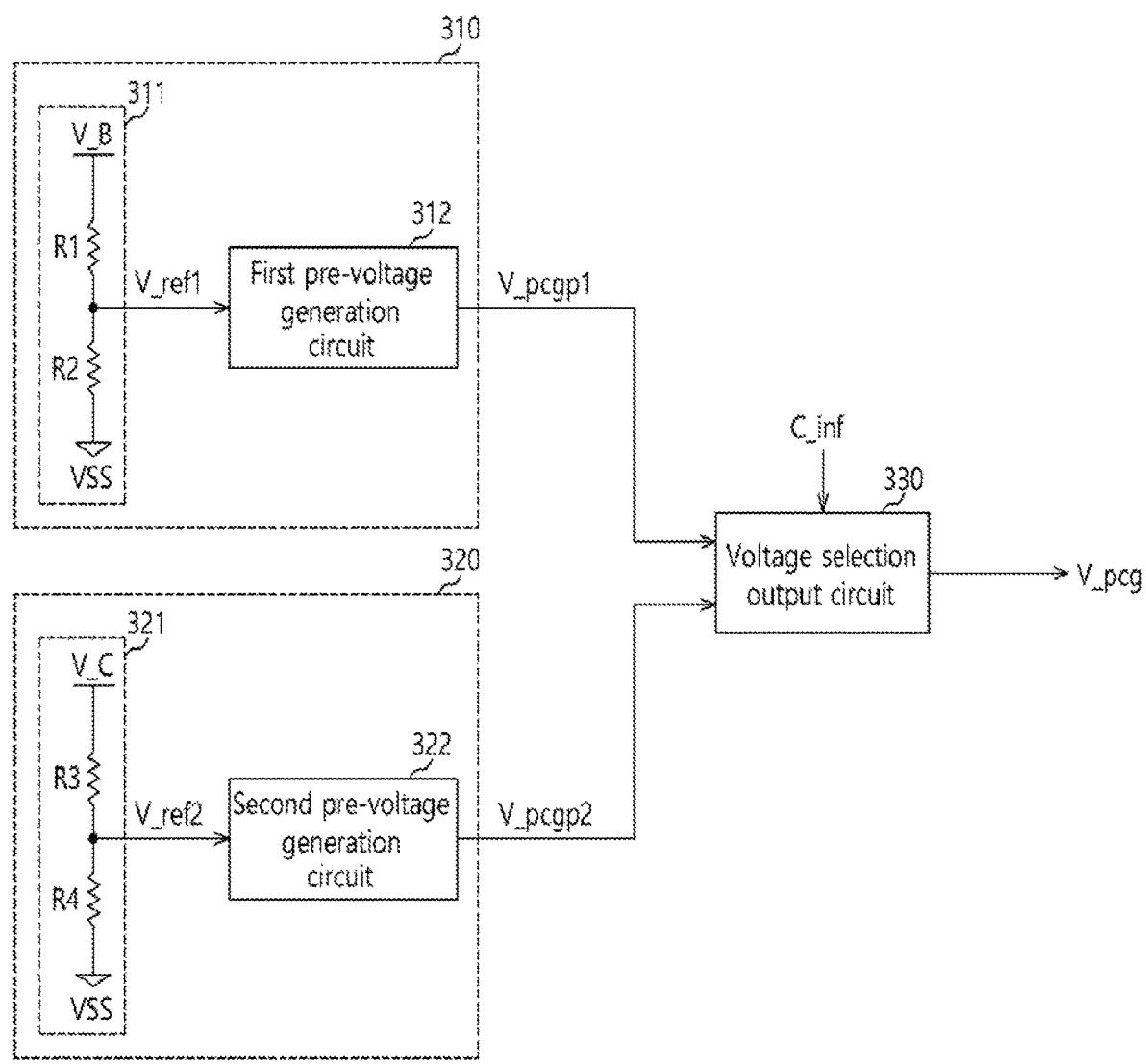
FIG. 3 is a configuration diagram illustrating a representation of an example of the precharge voltage generation circuit shown in FIG. 1.

As shown in FIG. 3, the precharge voltage generation circuit 300 may include a first pre-precharge voltage generation circuit 310, a second pre-precharge voltage generation circuit 320, and a voltage selection output circuit 330.

The first pre-precharge voltage generation circuit 310 may generate a first pre-precharge voltage V_pcgp1 of a voltage level lower than the voltage level of the second driving voltage V_B. For example, the first pre-precharge voltage generation circuit 310 may generate the first pre-precharge voltage V_pcgp1 which has a voltage level corresponding to ½ of the voltage level of the second driving voltage V_B.

The first pre-precharge voltage generation circuit 310 may include a first reference voltage generation circuit 311 and a first pre-voltage generation circuit 312.

The first reference voltage generation circuit 311 may generate a first reference voltage V_ref1 of a voltage level lower than the voltage level of the second driving voltage V_B. For example, the first reference voltage generation circuit 311 may generate the first reference voltage V_ref1 which has a voltage level corresponding to ½ of the voltage level of the second driving voltage V_B.

The first reference voltage generation circuit 311 may include first and second resistor elements R1 and R2. The first resistor element R1 has one end which is applied with the second driving voltage V_B. The second resistor element R2 has one end to which the other end of the first resistor element R1 is coupled and an other end to which the terminal of the ground voltage VSS is coupled. The first reference voltage V_ref1 is outputted from a node to which the first and second resistor elements R1 and R2 are coupled. The resistance levels of the first and second resistor elements R1 and R2 may be the same.

The first pre-voltage generation circuit 312 may generate the first pre-precharge voltage V_pcgp1 corresponding to the voltage level of the first reference voltage V_ref1. For example, the first pre-voltage generation circuit 312 may generate the first pre-precharge voltage V_pcgp1 of the same voltage level as the voltage level of the first reference voltage V_ref1.

The second pre-precharge voltage generation circuit 320 may generate a second pre-precharge voltage V_pcgp2 of a voltage level lower than the voltage level of the third driving voltage V_C. For example, the second pre-precharge voltage generation circuit 320 may generate the second pre-precharge voltage V_pcgp2 which has a voltage level corresponding to ½ of the voltage level of the third driving voltage V_C.

The second pre-precharge voltage generation circuit 320 may include a second reference voltage generation circuit 321 and a second pre-voltage generation circuit 322.

The second reference voltage generation circuit 321 may generate a second reference voltage V_ref2 of a voltage level lower than the voltage level of the third driving voltage V_C. For example, the second reference voltage generation circuit 321 may generate the second reference voltage V_ref2 which has a voltage level corresponding to ½ of the voltage level of the third driving voltage V_C.

The second reference voltage generation circuit 321 may include third and fourth resistor elements R3 and R4. The third resistor element R3 has one end which is applied with the third driving voltage V_C. The fourth resistor element R4 has one end to which the other end of the third resistor element R3 is coupled and an other end to which the terminal of the ground voltage VSS is coupled. The second reference voltage V_ref2 is outputted from a node to which the third and fourth resistor elements R3 and R4 are coupled. The resistance levels of the third and fourth resistor elements R3 and R4 may be the same.

The second pre-voltage generation circuit 322 may generate the second pre-precharge voltage V_pcgp2 corresponding to the voltage level of the second reference voltage V_ref2. For example, the second pre-voltage generation circuit 322 may generate the second pre-precharge voltage V_pcgp2 of the same voltage level as the voltage level of the second reference voltage V_ref2.

The voltage selection output circuit 330 may output one voltage of the first and second pre-precharge voltages V_pcgp1 and V_pcgp2 as the precharge voltage V_pcg in response to the cell characteristic information signal C_inf. For example, the voltage selection output circuit 330 may output the first pre-precharge voltage V_pcgp1 as the precharge voltage V_pcg when the cell characteristic information signal C_inf is enabled. The voltage selection output circuit 330 may output the second pre-precharge voltage V_pcgp2 as the precharge voltage V_pcg when the cell characteristic information signal C_inf is disabled.

The operation of the semiconductor memory apparatus in accordance with the embodiment, configured as mentioned above, will be described below.

If a memory cell is capable of retaining data for a time longer than the reference time, the cell characteristic information storage circuit 200 may provide the cell characteristic information signal C_inf which is enabled.

If the active signal ACT is enabled, the control signal generation circuit 110 may enable the first sense amplifier driving control signal SAP1 for the first predetermined time, and enable the second sense amplifier driving control signal SAP2 for the second predetermined time when the first sense amplifier driving control signal SAP1 is disabled. The control signal generation circuit 110 may enable the third sense amplifier driving control signal SAN for a period in which one of the first and second sense amplifier driving control signals SAP1 and SAP2 is enabled.

The voltage select signal generation circuit 120 may output the second sense amplifier driving control signal SAP2 as the first voltage select signal V_sel1 in response to the cell characteristic information signal C_inf which is enabled.

The voltage providing circuit 130 may apply the first driving voltage V_A to the first driving line RTO for the enable period of the first sense amplifier driving control signal SAP1. The voltage providing circuit 130 may apply the second driving voltage V_B to the first driving line RTO for the enable period of the first voltage select signal V_sel1. The voltage providing circuit 130 may apply the ground voltage VSS to the second driving line SB for the enable period of the third sense amplifier driving control signal SAN. The voltage providing circuit 130 may apply the precharge voltage V_pcg to the first and second driving lines RTO and SB for the enable period of the precharge signal PCG.

The precharge voltage generation circuit 300 may provide the precharge voltage V_pcg of a lower voltage level than when the cell characteristic information signal C_inf is disabled, to the voltage providing circuit 130 in response to the cell characteristic information signal C_inf which is enabled.

The sense amplifier 400 may operate by being applied with the voltages applied through the first and second driving lines RTO and SB.

If a memory cell is capable of retaining data for a time shorter than the reference time, the cell characteristic information storage circuit 200 may provide the cell characteristic information signal C_inf which is disabled.

If the active signal ACT is enabled, the control signal generation circuit 110 may enable the first sense amplifier driving control signal SAP1 for the first predetermined time, and enable the second sense amplifier driving control signal SAP2 for the second predetermined time when the first sense amplifier driving control signal SAP1 is disabled. The control signal generation circuit 110 may enable the third sense amplifier driving control signal SAN for a period in which one of the first and second sense amplifier driving control signals SAP1 and SAP2 is enabled.

The voltage select signal generation circuit 120 may output the second sense amplifier driving control signal SAP2 as the second voltage select signal V_sel2 in response to the cell characteristic information signal C_inf which is disabled.

The voltage providing circuit 130 may apply the first driving voltage V_A to the first driving line RTO for the enable period of the first sense amplifier driving control signal SAP1. The voltage providing circuit 130 may apply the third driving voltage V_C to the first driving line RTO for the enable period of the second voltage select signal V_sel2. The voltage providing circuit 130 may apply the ground voltage VSS to the second driving line SB for the enable period of the third sense amplifier driving control signal SAN. The voltage providing circuit 130 may apply the precharge voltage V_pcg to the first and second driving lines RTO and SB for the enable period of the precharge signal PCG.

The precharge voltage generation circuit 300 may provide the precharge voltage V_pcg of a higher voltage level than when the cell characteristic information signal C_inf is enabled, to the voltage providing circuit 130 in response to the cell characteristic information signal C_inf which is disabled.

The sense amplifier 400 may operate by being applied with the voltages applied through the first and second driving lines RTO and SB.

The semiconductor memory apparatus in accordance with an embodiment may determine a voltage level to be provided to the sense amplifier 400 for the enable period of the second sense amplifier driving control signal SAP2, in response to the cell characteristic information signal C_inf. That is to say, because the second driving voltage V_B is lower than the voltage level of the third driving voltage V_C, when the cell characteristic information signal C_inf is enabled, a voltage of a lower voltage level than when the cell characteristic information signal C_inf is disabled may be provided to the sense amplifier 400 through the first driving line RTO.

As a result, the semiconductor memory apparatus in accordance with an embodiment may provide a voltage of a lower voltage level to a sense amplifier if a memory cell is capable of retaining data for a longer time than a reference time in the enable period of the second sense amplifier driving control signal SAP2 than if the memory cell retains data for a time shorter than the reference time in the enable period of the second sense amplifier driving control signal SAP2.

The semiconductor memory apparatus in accordance with an embodiment may provide a voltage of a higher voltage level to a sense amplifier if a memory cell retains data for a time shorter than the reference time in the enable period of the second sense amplifier driving control signal SAP2 than if the memory cell retains data for a longer time than the reference time in the enable period of the second sense amplifier driving control signal SAP2.

Figure 4:
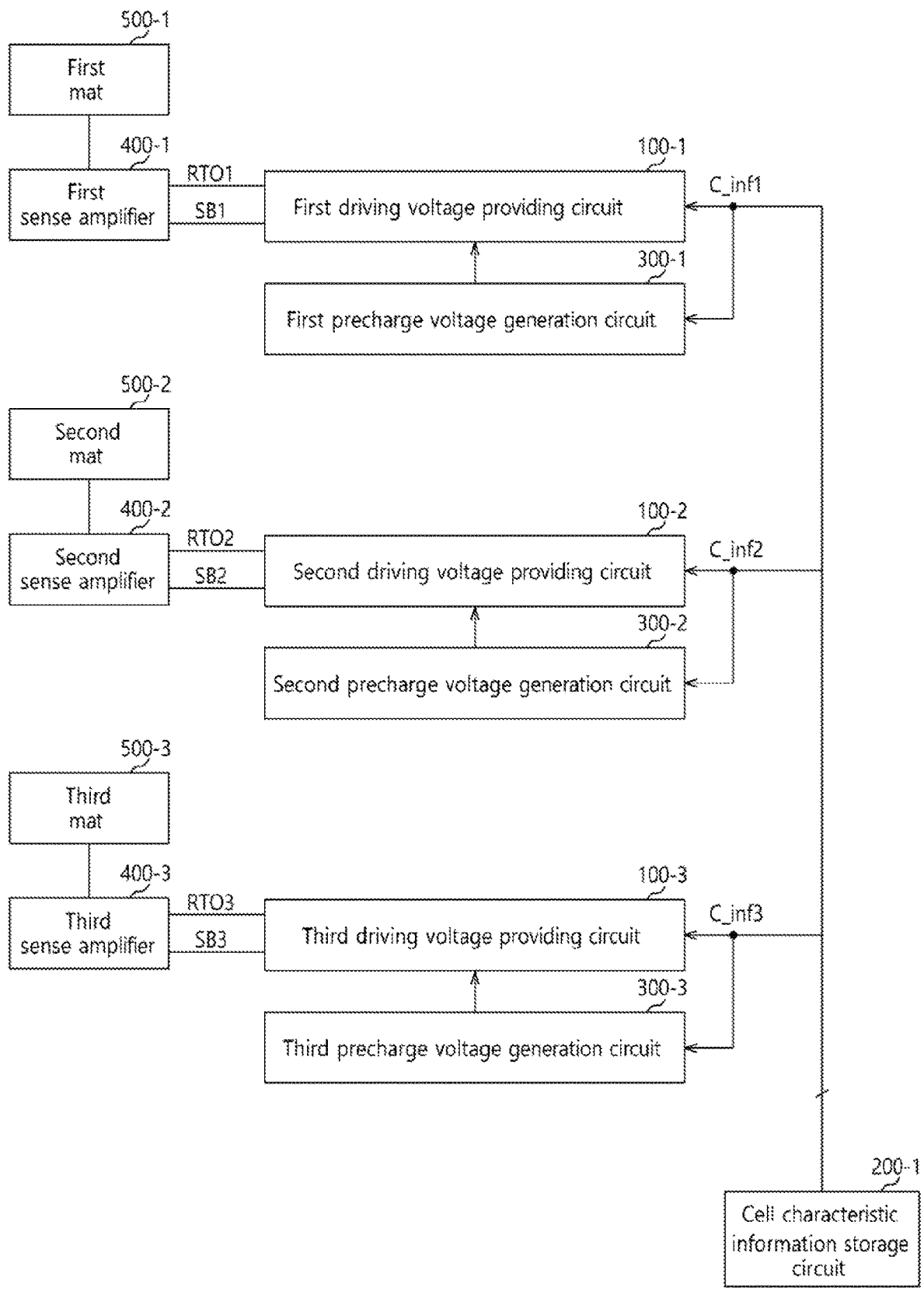
FIG. 4 is a configuration diagram illustrating a representation of an example of a semiconductor memory apparatus in accordance with an embodiment.

As shown in FIG. 4, a semiconductor memory apparatus in accordance with an embodiment may include first to third driving voltage providing circuits 100-1, 100-2 and 100-3, a cell characteristic information storage circuit 200-1, first to third precharge voltage generation circuits 300-1, 300-2 and 300-3, first to third sense amplifiers 400-1, 400-2 and 400-3, and first to third mats 500-1, 500-2 and 500-3. Each of the first to third driving voltage providing circuits 100-1, 100-2 and 100-3 may be configured in a substantially similar manner as the driving voltage providing circuit 100 of FIG. 1, and each of the first to third precharge voltage generation circuits 300-1, 300-2 and 300-3 may be configured in a substantially similar manner as shown in FIG. 3.

The first mat 500-1 may be electrically coupled with the first sense amplifier 400-1, and the first sense amplifier 400-1 may be electrically coupled with the first driving voltage providing circuit 100-1, and the first precharge voltage generation circuit 300-1 may be electrically coupled with the first driving voltage providing circuit 100-1.

The second mat 500-2 may be electrically coupled with the second sense amplifier 400-2, and the second sense amplifier 400-2 may be electrically coupled with the second driving voltage providing circuit 100-2, and the second precharge voltage generation circuit 300-2 may be electrically coupled with the second driving voltage providing circuit 100-2.

The third mat 500-3 may be electrically coupled with the third sense amplifier 400-3, and the third sense amplifier 400-3 may be electrically coupled with the third driving voltage providing circuit 100-3, and the third precharge voltage generation circuit 300-3 may be electrically coupled with the third driving voltage providing circuit 100-3.

The cell characteristic information storage circuit 200-1 may store information about the characteristics of a memory cell included in the first mat 500-1, as a first cell characteristic information signal C_inf1. The cell characteristic information storage circuit 200-1 may store information about the characteristics of a memory cell included in the second mat 500-2, as a second cell characteristic information signal C_inf2. The cell characteristic information storage circuit 200-1 may store information about the characteristics of a memory cell included in the third mat 500-3, as a third cell characteristic information signal C_inf3. The cell characteristic information storage circuit 200-1 may provide the first cell characteristic information signal C_inf1 to the first driving voltage providing circuit 100-1 and the first precharge voltage generation circuit 300-1. The cell characteristic information storage circuit 200-1 may provide the second cell characteristic information signal C_inf2 to the second driving voltage providing circuit 100-2 and the second precharge voltage generation circuit 300-2. The cell characteristic information storage circuit 200-1 may provide the third cell characteristic information signal C_inf3 to the third driving voltage providing circuit 100-3 and the third precharge voltage generation circuit 300-3.

For example, if the first to third cell characteristic information signals C_inf1, C_inf2 and C_inf3 have the same information, that is, have the same level, the respective first to third driving voltage providing circuits 100-1, 100-2 and 100-3 may selectively provide a driving voltage of the same level to the respective first to third sense amplifiers 400-1, 400-2 and 400-3 through driving lines RTO1, SB1, RTO2, SB2, RTO3 and SB3, and the respective first to third precharge voltage generation circuits 300-1, 300-2 and 300-3 provide a precharge voltage of the same level to the respective first to third sense amplifiers 400-1, 400-2 and 400-3 through the driving lines RTO1, SB1, RTO2, SB2, RTO3 and SB3. Further, each of the respective first to third driving voltage providing circuits 100-1, 100-2, and 100-3 may provide a driving voltage of a lower level when a corresponding cell characteristic information signal is enabled than when the corresponding cell characteristic information signal is disabled.

If a signal including different information, that is, a signal having a different level than the other signals, exists among the first to third cell characteristic information signals C_inf1, C_inf2 and C_inf3, a driving voltage providing circuit and a precharge voltage generation circuit which are inputted with a cell characteristic information signal of a different level provide a driving voltage and a precharge voltage of levels different from the other driving voltage providing circuits and the other precharge voltage generation circuits, to a corresponding sense amplifier. The first to third precharge voltage generation circuits 300-1, 300-2, and 300-3 may determine voltage levels in response to respective cell characteristic information signals C_inf1, C_inf2, and C_inf3, and output precharge voltages of the determined voltage levels to the driving voltage providing circuits 100-1, 100-2 and 100-3, respectively. Further, each of the first to third precharge voltage generation circuits 300-1, 300-2, and 300-3 may generate a precharge voltage of a lower voltage level when at least one of a corresponding cell characteristic information signal C_inf1, C_inf2, and C_inf3 is enabled than when the corresponding cell characteristic information signal C_inf1, C_inf2, and C_inf3 is disabled.

Therefore, the cell characteristic information storage circuit 200-1 may transfer voltages of different voltage levels according to the characteristics of memory cells included in the first to third mats 500-1, 500-2 and 500-3, to the respective sense amplifiers 400-1, 400-2 and 400-3.

While various embodiments have been described above, it will be understood to those skilled in the art that the embodiments described are examples only. Accordingly, the semiconductor memory apparatus described herein should not be limited based on the described embodiments.

Figure 5:
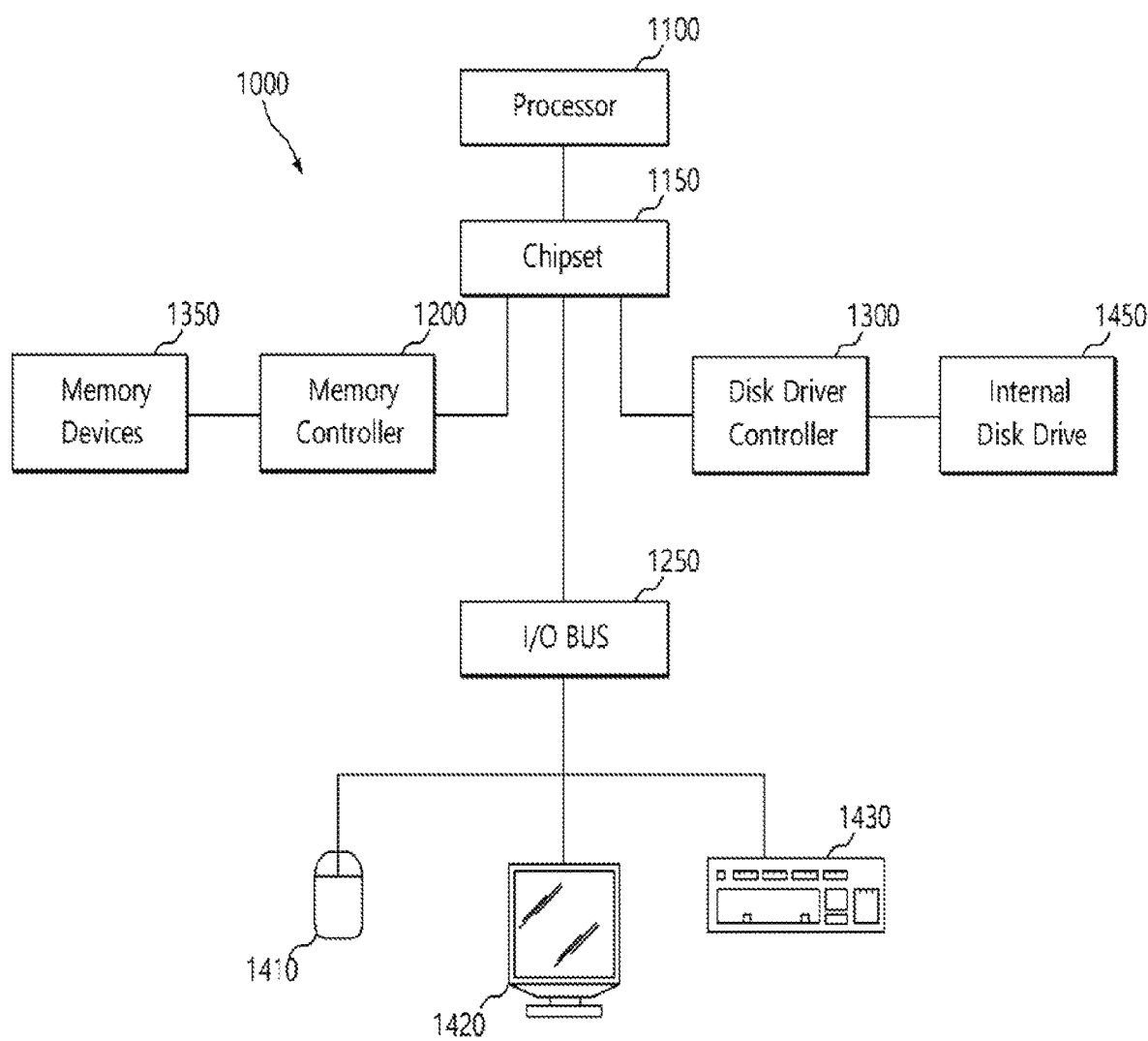
FIG. 5 illustrates a block diagram of an example of a representation of a system employing the semiconductor memory apparatus in accordance with the various embodiments discussed above with relation to FIGS. 1-4.

The semiconductor memory apparatus discussed above (see FIGS. 1-4) are particularly useful in the design of memory devices, processors, and computer systems. For example, referring to FIG. 5, a block diagram of a system employing a semiconductor memory apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor memory apparatus as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a system 1000 employing a semiconductor memory apparatus as discussed above with relation to FIGS. 1-4. In alternate embodiments, such as, for example but not limited to, cellular phones or digital cameras, the components may differ from the embodiments illustrated in FIG. 5.

What is claimed is:

1. A semiconductor memory apparatus comprising:
   a plurality of mats;
   a plurality of sense amplifiers electrically coupled with the plurality of mats, respectively; and
   a plurality of driving voltage providing circuits configured to provide driving voltages selectively to the plurality of sense amplifiers, respectively, in response to a plurality of cell characteristic information signals,
   wherein each of the plurality of cell characteristic information signals defines whether a data retention time of a corresponding mat of the plurality of mats is longer than a reference time.

2. The semiconductor memory apparatus according to claim 1, wherein each of the plurality of driving voltage providing circuits provides a driving voltage of a lower voltage level among the driving voltages when a corresponding cell characteristic information signal is enabled than when the corresponding cell characteristic information signal is disabled.

3. The semiconductor memory apparatus according to claim 2, wherein the respective cell characteristic information signals include information according to characteristics of memory cells of the respective mats.

4. The semiconductor memory apparatus according to claim 3, further comprising:

a cell characteristic information storage circuit suitable for providing the plurality of cell characteristic information signals.

5. The semiconductor memory apparatus according to claim 1, further comprising:
a plurality of precharge voltage generation circuits suitable for determining voltage levels in response to the plurality of respective cell characteristic information signals, and outputting precharge voltages of the determined voltage levels to the driving voltage providing circuits, respectively.

6. The semiconductor memory apparatus according to claim 5, wherein each of the plurality of precharge voltage generation circuits generates a precharge voltage of a lower voltage level when a corresponding cell characteristic information signal is enabled than when the corresponding cell characteristic information signal is disabled.

7. The semiconductor memory apparatus according to claim 1, if the plurality of cell characteristic information signals have a same level, the plurality of driving voltage providing circuits are configured to provide a driving voltage of the same level to the plurality of sense amplifiers.

8. The semiconductor memory apparatus according to claim 7, wherein if the plurality of cell characteristic information signals have a same level, a plurality of precharge voltage generation circuits are configured to provide a precharge voltage of the same level to the respective plurality sense amplifiers through a plurality of driving lines.

* * * * *